(12) United States Patent
Riederer

(10) Patent No.: US 9,018,952 B2
(45) Date of Patent: Apr. 28, 2015

(54) METHOD FOR SELF-CALIBRATED PARALLEL MAGNETIC RESONANCE IMAGE RECONSTRUCTION

(75) Inventor: Stephen J Riederer, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 485 days.

(21) Appl. No.: 13/478,017

(22) Filed: May 22, 2012

(65) Prior Publication Data

US 2012/0299590 A1 Nov. 29, 2012

Related U.S. Application Data

(60) Provisional application No. 61/490,699, filed on May 27, 2011.

(51) Int. Cl.
*G01V 3/00* (2006.01)
*G01R 33/561* (2006.01)
*G01R 33/563* (2006.01)

(52) U.S. Cl.
CPC ...... *G01R 33/5611* (2013.01); *G01R 33/56308* (2013.01)

(58) Field of Classification Search
CPC .................................................. G01R 33/5611
USPC .................................. 324/309, 307, 306, 312
See application file for complete search history.

(56) References Cited

U.S. PATENT DOCUMENTS

| | | | |
|---|---|---|---|
| 6,289,232 B1 | 9/2001 | Jakob et al. | |
| 6,714,010 B2 | 3/2004 | Madore | |
| 7,486,074 B2 * | 2/2009 | McKenzie et al. | 324/309 |
| 7,592,809 B1 * | 9/2009 | King et al. | 324/309 |
| 7,860,291 B2 | 12/2010 | Hwang | |
| 7,884,604 B2 * | 2/2011 | Kholmovski et al. | 324/309 |
| 8,099,148 B2 * | 1/2012 | Madore | 600/410 |
| 8,334,694 B2 * | 12/2012 | Tan et al. | 324/309 |
| 8,461,840 B2 * | 6/2013 | Stemmer | 324/309 |
| 8,854,040 B2 * | 10/2014 | Kannengiesser et al. | 324/309 |
| 2008/0303521 A1 | 12/2008 | Beatty et al. | |
| 2010/0182008 A1 | 7/2010 | Tan et al. | |

OTHER PUBLICATIONS

Tan et al, Inversion Recovery With Embedded Self-Calibration (IRES), Magnetic Resonance in Medicine 62:459-467 (2009).
Arunachalam et al, Self-Calibrated GRAPPA Method for 2D and 3D Radial Data, Magnetic Resonance in Medicine 57:931-938 (2007.
Qian et al, Self-Calibrated Spiral SENSE, Magnetic Resonance in Medicine 52:688-692 (2004).

* cited by examiner

*Primary Examiner* — Louis Arana
(74) *Attorney, Agent, or Firm* — Quarles & Brady, LLP

(57) ABSTRACT

A method for producing a time-series of images of a subject with a magnetic resonance imaging (MRI) system is provided. The MRI system is used to acquire a time-series undersampled k-space data set, in which a selected number of k-space data subsets in the time-series data set includes both image data and calibration data. Moreover, the calibration data in each of these selected number of k-space data subsets includes a portion of a desired total amount of calibration data. For example, each of these selected number of k-space data subsets include calibration data that is acquired by sampling a different partition of a calibration data sampling pattern. A time-series of images of the subject is then produced by reconstructing images of the subject from the acquired time-series of undersampled k-space data sets. These images are substantially free of undersampling artifacts.

13 Claims, 7 Drawing Sheets

METHOD FOR SELF-CALIBRATED PARALLEL MAGNETIC RESONANCE IMAGE RECONSTRUCTION

CROSS-REFERENCE

This application is based on, claims priority to, and incorporates herein by reference in its entirety, U.S. Provisional Application Ser. No. 61/490,699, entitled, "METHOD FOR SELF-CALIBRATED PARALLEL MAGNETIC RESONANCE IMAGE RECONSTRUCTION," and filed May 27, 2011.

STATEMENT REGARDING FEDERALLY SPONSORED RESEARCH

This invention was made with government support under HL070620 awarded by the National Institutes of Health. The government has certain rights in the invention.

BACKGROUND OF THE INVENTION

The present invention relates generally to systems and methods for magnetic resonance imaging ("MRI") and, more particularly, the invention relates to systems and methods for image reconstruction in parallel MRI.

Contrast-enhanced magnetic resonance angiography ("CE-MRA") is a method whereby magnetic resonance imaging ("MRI") techniques are used to image blood vessels of the body after administering a contrast agent to the patient. Typically, a moderate amount of a gadolinium-based contrast agent is injected into a vein in the patient's arm. The contrast agent then makes its way into circulation through the patient's vasculature. The presence of the contrast agent in the blood causes the net relaxation time of the blood to be altered from its unenhanced value. MR acquisition methods can exploit this change in relaxation time, causing the enhanced blood within the vasculature to be significantly brighter compared to other structures within the imaging field-of-view ("FOV").

There are technical challenges associated with performing CE-MRA. First, to obtain a three-dimensional image with adequate spatial resolution, it is necessary to have a sufficiently long acquisition time. Depending on the FOV and the desired spatial resolution, the time necessary to provide the degree of sampling required to achieve this spatial resolution can range from ten seconds to several minutes. Second, the initiation of the MRI data acquisition must be matched to the arrival of the contrast-enhanced blood within the vessels of interest, and this injection-to-arrival time is variable from patient to patient. Third, it is generally desirable to generate an angiogram in which there is negligible contrast enhancement within the companion venous system. These challenges have been addressed in various ways. For example, short repetition time ("TR") gradient echo sequences allow rapid collection of MRI data. Synchronizing the acquisition to the contrast arrival can also be done using a test bolus or fluoroscopic triggering. Extension of the acquisition duration well into the venous phase, but with intrinsic suppression of venous signals, can be done using various centric phase encoding view orders.

Parallel imaging is a method whereby the redundancy in samples collected from multiple receiver coils is used to reduce the number of repetitions of the pulse sequence, and thus the acquisition time, that is necessary to generate an image with a given spatial resolution. Parallel imaging is generally implemented by a modification of the sampling of k-space along one or more phase encoding directions. These phase encoding directions commonly the $k_y$ direction for two-dimensional acquisitions, and both the $k_y$ and $k_z$ directions for three-dimensional acquisitions. Although parallel imaging can be implemented in non-Cartesian MR acquisitions, most applications to date have used Cartesian approaches with 2DFT or 3DFT sampling.

The degree of undersampling provided by a parallel acquisition is referred to as the acceleration, R. For a 3DFT acquisition, the undersampling can be applied separately along both the $k_y$ direction, providing an acceleration $R_y$, and along the $k_z$ direction, providing an acceleration $R_z$. Undersampling in two directions like this results in an overall acceleration of $R=R_y \times R_z$. The reduction in acquisition time achievable with parallel imaging acquisitions has allowed time-resolved methods to be used with frame times in the 5-10 second range, and with spatial resolution superior to that of non-accelerated acquisitions.

Implementation of parallel acquisition requires extra data and extra mathematical processing beyond that of standard image reconstruction. The extra data includes images of the sensitivity profiles of the individual receiver coils over the object. For image-space-based approaches to parallel acquisition, such as SENSE, the coil sensitivity maps are generated from separate acquisitions, generally made before the SENSE-accelerated scan. For k-space-based approaches to parallel acquisition, such as GRAPPA, the additional data is acquired within the accelerated acquisition, increasing the overall number of points acquired and forcing the acceleration, R, to be reduced to some smaller value, $R_{net}$. The key point of this discussion is that for both approaches to parallel imaging, there is overhead time required for the implementation of the parallel acquisition, primarily due to the need to acquire calibration data.

It would therefore be desirable to provide a method for parallel imaging in which calibration data could be acquired without a reduction in acceleration, R, and without additional constraints on data acquisition time.

SUMMARY OF THE INVENTION

The present invention overcomes the aforementioned drawbacks by providing a method for parallel imaging in which calibration data is integratively acquired with image data for a selected number of time frames in a time-series. Each time frame of k-space data that contains calibration data samples a different portion of the total calibration sampling pattern, thereby mitigating undesirable reductions in the acceleration factor, R. Moreover, because the calibration data is integratively acquired with image data, the provided method improves the temporal scan requirements of previous SENSE-like acquisitions.

In accordance with one aspect of the invention, a magnetic resonance imaging (MRI) system is disclosed that includes a magnet system configured to generate a polarizing magnetic field about at least a portion of a subject arranged in the MRI system and a magnetic gradient system including a plurality of magnetic gradient coils configured to apply at least one magnetic gradient field to the polarizing magnetic field. The MRI system also includes a radio frequency (RF) system configured to apply an RF field to the subject and to receive magnetic resonance signals therefrom in parallel. The MRI system further includes a computer system programmed to control operation of the magnetic gradient system and RF system to perform a pulse sequence in accordance with a parallel imaging acquisition to acquire a time-series undersampled k-space data set that include both an image data set and a calibration data set. The computer system is also configured to reconstruct the image data set into a time-series of images of the subject using the calibration data set.

In accordance with another aspect of the invention, a method for producing a time-series of images of a subject with a magnetic resonance imaging (MRI) system is disclosed. The method includes acquiring with the MRI system, a time-series undersampled k-space data set in which a selected number of k-space data subsets in the time-series undersampled k-space data set include both image data and calibration data, and in which the calibration data in each of the selected number of k-space data subsets includes a portion of a desired total amount of calibration data. The method also includes producing a time-series of images of the subject by reconstructing images of the subject that are substantially free of undersampling artifacts from the acquired time-series undersampled k-space data sets.

In accordance with yet another aspect of the invention, a non-transitive, computer-readable storage medium having stored thereon a set of instructions is disclosed. The instructions, when executed by a computer processor, causes the computer processor to control a magnetic resonance imaging (MRI) system to perform a pulse sequence that acquires a time-series k-space data set that includes a selected number of combined data sets that contain both calibration data and image data, and a number of image data sets that contain only image data. The calibration data in the selected number of combined data sets is acquired by sampling a different partition of a calibration sampling pattern for each of the selected number of combined data sets.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

A method for self-calibrated parallel magnetic resonance imaging is provided. The provided method is applicable to time-resolved studies in which images at multiple different time frames are obtained. Image data is acquired by sampling k-space in a manner sufficient to accelerate the overall acquisition while obtaining self-calibration information. By way of example, for an imaging study having thirty time frames, approximately one-thirtieth or less of the calibration data can be embedded into the acquisition time for each frame. When applied to GRAPPA-like data acquisitions, the provided method advantageously reduces the amount of calibration data collected within each time frame by apportioning the data across multiple time frames. As a result, the erosion of acceleration intrinsic to GRAPPA may be reduced.

The proposed method of embedded self-calibration in accelerated time-resolved MRI can be described with respect to k-space sampling. As is known to those skilled in the art of MRI physics, k-space is a representation of data acquisition space. Each point sampled during the course of the MRI data acquisition can be assigned to a location ($k_x,k_y,k_z$) in k-space based on the time-varying signals of the gradient waveforms occurring up to the time instant that location is sampled. It is desirable to sample k-space across a broad range of locations.

Figure 1:
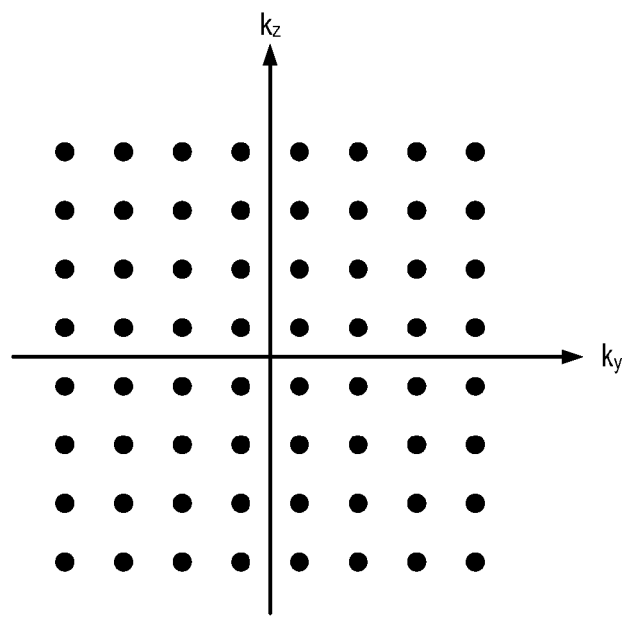
FIG. 1 is a pictorial representation of an exemplary three-dimensional Cartesian k-space sampling pattern that satisfies the Nyquist criterion.

For 3DFT acquisitions, k-space is conveniently represented as the $k_y$-$k_z$ plane. An exemplary depiction of this k-space sampling pattern is illustrated in FIG. 1. The $k_x$-direction is assumed to come out of the plane of the plot shown, and samples along the entire $k_x$-direction are generated within each repetition of an MR data acquisition. An individual sample, or "view," at a specific $k_y$-$k_z$ position of the plot is generated during each repetition of the 3DFT acquisition. In MR data acquisition with Cartesian sampling, the data points are sampled discretely along parallel rows in $k_y$-$k_z$ space as shown in FIG. 1. The spacing between points is equal to the reciprocal of the field-of-view ("FOV") of the acquisition along the corresponding direction. For example:

$$\Delta k_y = \frac{1}{FOV_y}; \quad (1)$$

and $$\Delta k_z = \frac{1}{FOV_z}. \quad (2)$$

The largest k-value sampled along each direction is determined by how fine the spatial resolution is to be in the final image along that direction, with finer resolution causing more extended k-space sampling. Suppose the numbers of samples along the $k_y$- and $k_z$-directions are $N_y$ and $N_z$, respectively. Then, with the absence of any specific means for scan time reduction, the acquisition time, $T_{ACQ}$, for a 3DFT acquisition is given by:

$$T_{ACQ} = TR \cdot N_y \cdot N_z \quad (3).$$

For both SENSE-like and GRAPPA-like acceleration techniques, data acquisition acceleration is fundamentally obtained by sampling k-space more coarsely than demanded by the Nyquist criterion. As an example, suppose that acceleration $R_y$ along the $k_y$-direction is set to be $R_y$=2, and similarly for $k_z$, $R_z=2$. The resultant baseline k-space sampling pattern for this undersampled situation is shown in FIG. 2, with the increments between samples now increased over FIG. 1 in proportion to the acceleration values used.

Figure 2:
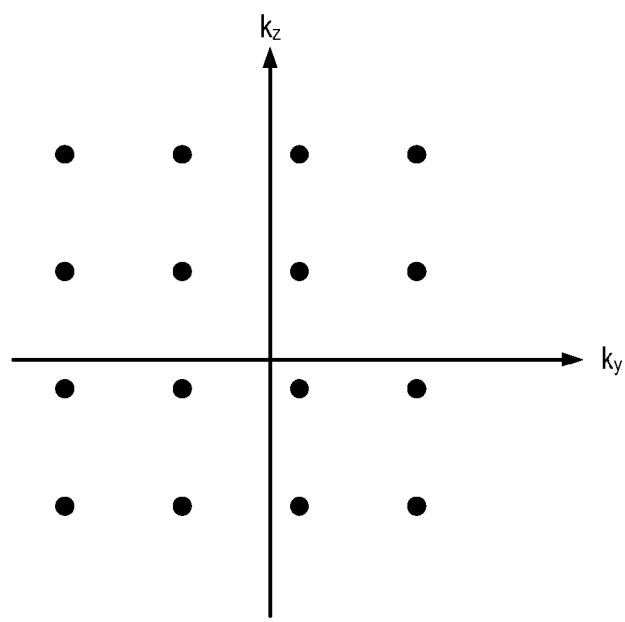
FIG. 2 is a pictorial representation of an exemplary three-dimensional Cartesian k-space sampling pattern in which k-space is undersampled by a factor of two along both the $k_y$- and $k_z$- directions, resulting in an acceleration of R=4.
Figure 3:
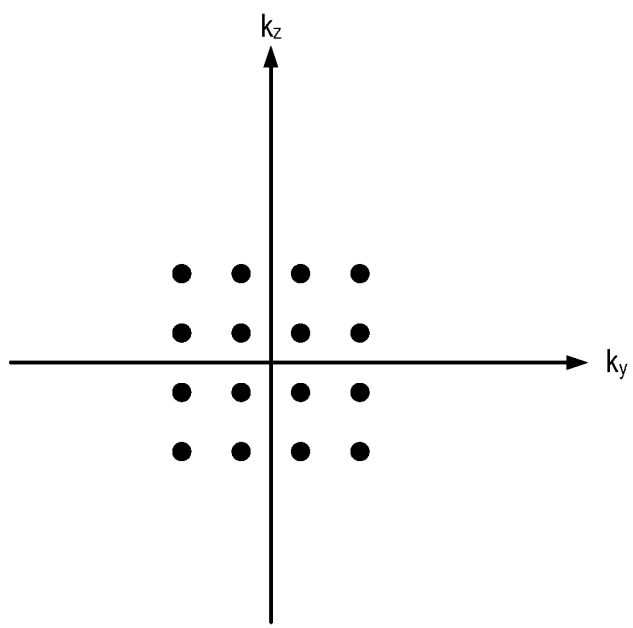
FIG. 3 is a pictorial representation of an exemplary three-dimensional Cartesian k-space sampling pattern used for acquiring calibration data for an image-space-based parallel image reconstruction technique.

To implement an acceleration technique requires data beyond the undersampled k-space data of FIG. 2. For the SENSE method such data form "coil sensitivity" maps. An image of the sensitivity of each individual coil element in the receiver coil array over the object of interest must be generated. This is generally done by acquiring a calibration image, again using an MR data acquisition that can itself be analyzed in its own k-space. The sensitivity map must be valid over the entire FOV of the object, and, consequently, the sampling increment must be no larger than that used in the reference, given by Eqns. (1)-(2). However, because the sensitivity map is generally smoothly varying across the object, with no abrupt changes, the spatial resolution need not be as fine as in the reference image of the object, and consequently the extent of k-space that is sampled can be reduced. A schematic k-space sampling of a calibration image that meets these conditions is shown in FIG. 3.

Figure 4:
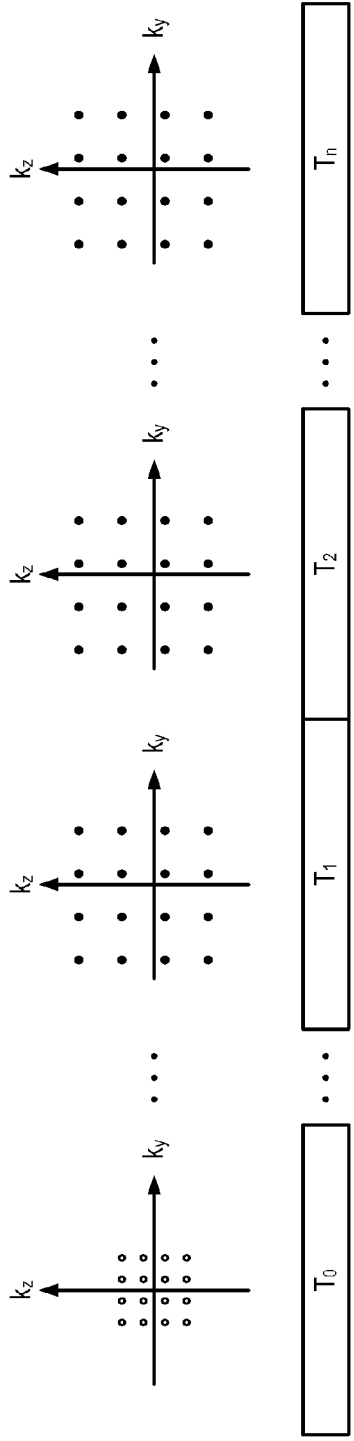
FIG. 4 is a pictorial representation of an exemplary time-resolved series of three-dimensional Cartesian k-space sampling patterns used for a SENSE acquisition.

The typical sequence of scans required to generate a time-resolved series of SENSE-accelerated 3D images is shown in FIG. 4. The sequence starts off with acquisition of the sensitivity maps using a calibration scan at a time $T_0$, similar to that of FIG. 3. The same scan is used to generate sensitivity data for all coil elements. The k-space sampling pattern for this acquisition is designated by the white points. Next, the time-resolved SENSE-accelerated scan is performed at times $T_1$, $T_2, \ldots, T_n$. The k-space sampling pattern for each time frame is designated by black points and is similar to the pattern illustrated in FIG. 2. After these two acquisitions are performed, the exam is complete.

As will be described, the present invention can be applied to GRAPPA-like acceleration techniques in addition to SENSE-like acceleration techniques. With GRAPPA, the mathematical processing for implementing the acceleration process is performed in k-space. Specifically, fully sampled calibration data are acquired at relatively low spatial frequencies, and this information is used to determine the correlation between measurements at neighboring k-space points due to the coil response functions in k-space having a finite width. Incorporation of calibration into the accelerated acquisition imposes a penalty in that undersampling can no longer be applied uniformly across k-space, causing the nominal acceleration, R, of uniform undersampling to be reduced to smaller net acceleration, $R_{net}$.

Figure 5:
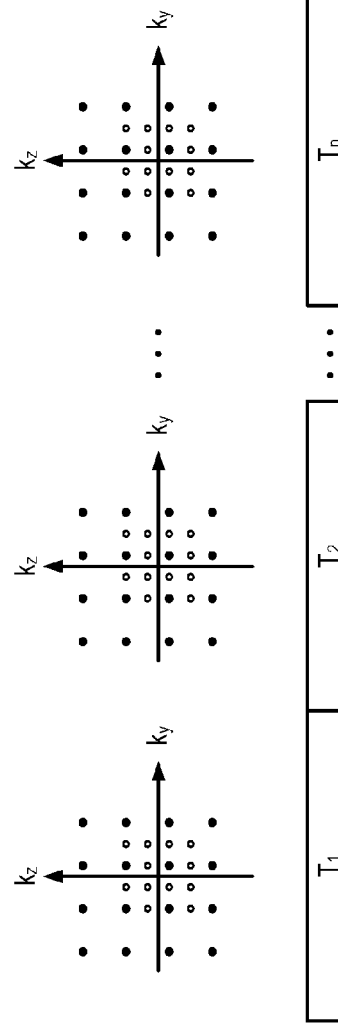
FIG. 5 is a pictorial representation of an exemplary time-resolved series of three-dimensional Cartesian k-space sampling patterns used for a GRAPPA acquisition.

An exemplary time-resolved 3D GRAPPA acquisition is illustrated in FIG. 5, in which the sampling pattern for the GRAPPA acquisition includes a twofold nominal acceleration along the $K_y$ and $k_z$ directions, yielding and acceleration of $R=R_y \times R_z=4$. The number of sampled points in this case is twenty-five percent of the Nyquist criterion, or sixteen; however, because of the need to sample the calibration data points for the GRAPPA reconstruction, the total number of points sampled in this example is twenty-eight. As a result of acquiring the calibration data, the actual number of data points acquired for each time frame is only about forty-four percent of the Nyquist criterion. This yields a net acceleration, $R_{net}$, of 2.28, which is smaller than the nominal acceleration of R=4. Each time frame in the series is subjected to the same sampling pattern and, thus, is subjected also to the same level of reduction of the acceleration from R=4 to $R_{net}=2.28$.

Figure 6:
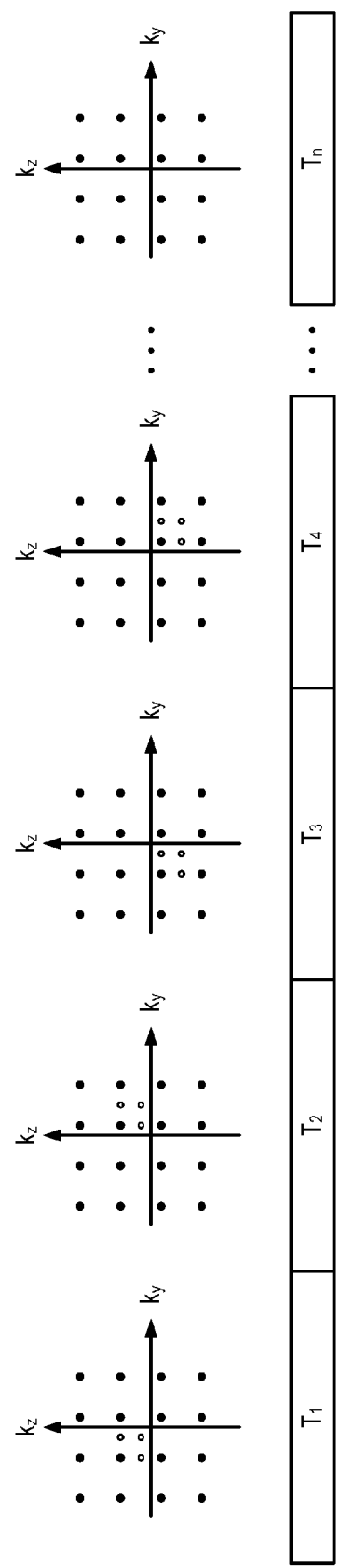
FIG. 6 is a pictorial representation of an exemplary time-resolved series of three-dimensional Cartesian k-space sampling patterns in accordance with embodiments of the invention.

Referring to FIG. 6, the present invention can be illustrated. In the case of SENSE-like accelerations, unlike traditional SENSE imaging methods, the separate calibration scan is eliminated and the calibration data integrated into the overall data acquisition process. For example, as illustrated in FIG. 6, a first time frame acquired at time $T_1$ includes image data samples at a plurality of k-space locations indicated by the black points. In addition to these image data samples, a number of calibration data samples are acquired by sampling the k-space locations indicated by the white points. While this acquisition scheme increases the time required to acquire any given time frame, the provided method has the benefit of eliminating the otherwise time-consuming calibration step.

One might expect that the total time spent in calibration and the multiple SENSE acquisitions does not change. That is, one might expect that the elimination of the separate calibration scan is balanced by the addition of acquiring calibration data during the data acquisition process; however, it has been discovered that overall scan time can be reduced by implementing the provided method. This is occurs whenever a given k-space location is to be sampled both for calibration and for SENSE acceleration. For example, as illustrated in FIG. 6, the calibration data and image data can be overlapped at some locations in k-space, thereby eliminating the need to redundantly sample the same k-space location as would be the case with a separate calibration scan. Thus, a marked decrease in scan time can be achieved with the provided method as compared to those data acquisition methods that require a separate calibration scan.

Application of the provided method to GRAPPA using, for example, the sampling scheme illustrated in FIG. 6 is also possible because the calibration data is integrated with the overall acquisition. In this example, only nineteen locations are sampled per time frame, which is only about thirty percent of the Nyquist criterion. Thus, the erosion of the nominal acceleration of R=4 is mitigated and the net acceleration factor, $R_{net}$, is 3.36, which is not nearly as severe as 2.28 in the previous example.

The above implementations of time-resolved SENSE and GRAPPA have assumed that the entirety of the undersampled k-space is sampled each time frame. It is also possible, however, to combine the provided method with sampling patterns in which view sharing is performed. In such methods, certain image data samples will be shared from one time frame to the next, thereby providing a further decrease in scan time without detrimentally affecting net acceleration.

Figure 7:
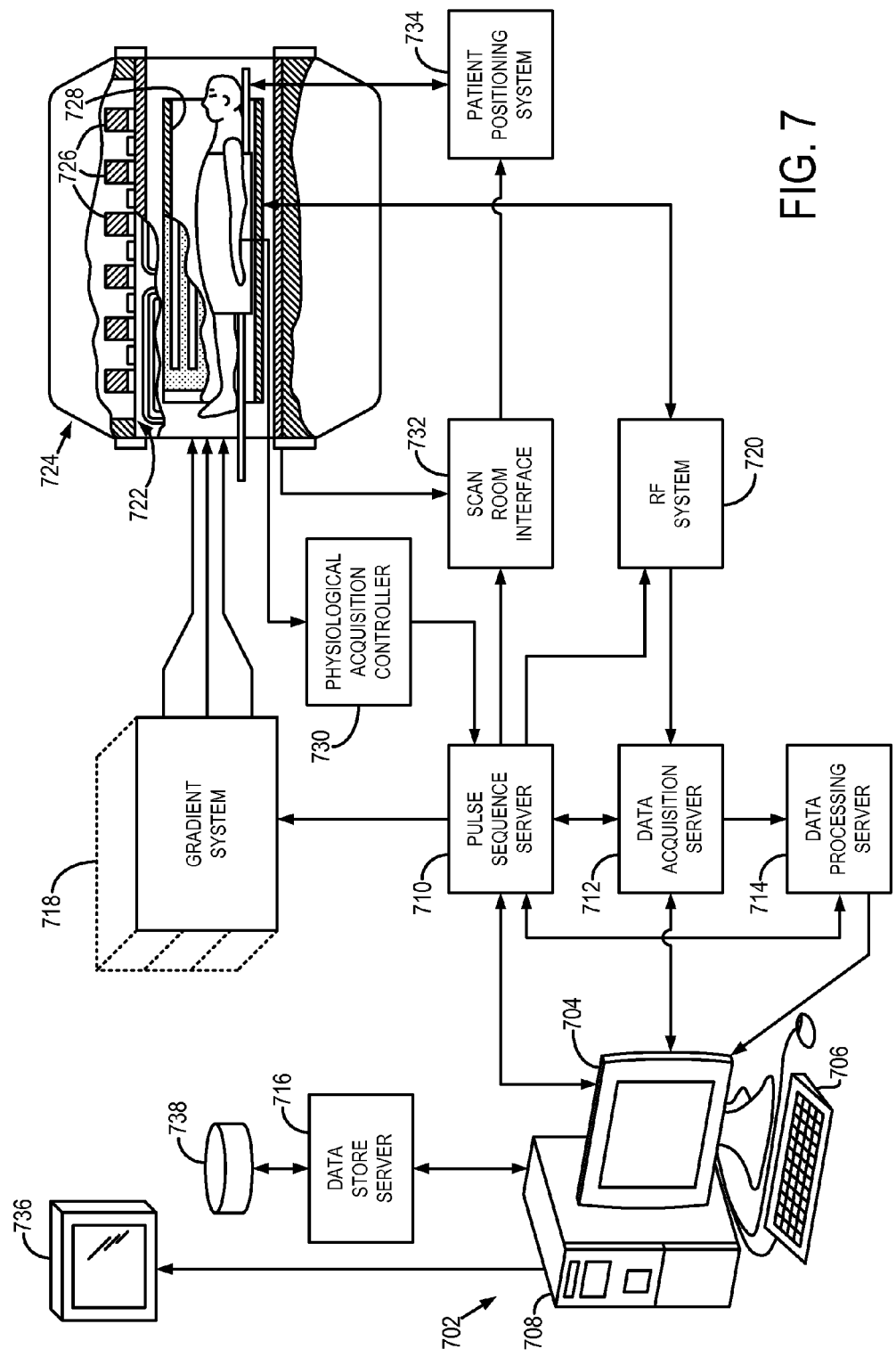
FIG. 7 is a block diagram of an exemplary magnetic resonance imaging ("MRI") system that employs embodiments of the present invention.

Referring particularly now to FIG. 7, an exemplary magnetic resonance imaging ("MRI") system 700 capable of practicing embodiments of the present invention is illustrated. The MRI system 700 includes a workstation 702 having a display 704 and a keyboard 706. The workstation 702 includes a processor 708, such as a commercially available programmable machine running a commercially available operating system. The workstation 702 provides the operator interface that enables scan prescriptions to be entered into the MRI system 700. The workstation 702 is coupled to four servers: a pulse sequence server 710; a data acquisition server 712; a data processing server 714, and a data store server 716. The workstation 702 and each server 710, 712, 714 and 716 are connected to communicate with each other.

The pulse sequence server 710 functions in response to instructions downloaded from the workstation 702 to operate a gradient system 718 and a radiofrequency ("RF") system 720. Gradient waveforms necessary to perform the prescribed scan are produced and applied to the gradient system 718, which excites gradient coils in an assembly 722 to produce the magnetic field gradients $G_x$, $G_y$, and $G_z$ used for position encoding MR signals. The gradient coil assembly 722 forms part of a magnet assembly 724 that includes a polarizing magnet 726 and a whole-body RF coil 728.

RF excitation waveforms are applied to the RF coil 728, or a separate local coil (not shown in FIG. 7), by the RF system 720 to perform the prescribed magnetic resonance pulse sequence. Responsive MR signals detected by the RF coil 728, or a separate local coil (not shown in FIG. 7), are received by the RF system 720, amplified, demodulated, filtered, and digitized under direction of commands produced by the pulse sequence server 710. The RF system 720 includes an RF transmitter for producing a wide variety of RF pulses used in MR pulse sequences. The RF transmitter is responsive to the scan prescription and direction from the pulse sequence server 710 to produce RF pulses of the desired frequency, phase, and pulse amplitude waveform. The generated RF pulses may be applied to the whole body RF coil 728 or to one or more local coils or coil arrays (not shown in FIG. 7).

The RF system 720 also includes one or more RF receiver channels. Each RF receiver channel includes an RF amplifier that amplifies the MR signal received by the coil 728 to which it is connected, and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2} \qquad (4);$$

and the phase of the received MR signal may also be determined:

$$\varphi = \tan^{-1}\left(\frac{Q}{I}\right). \qquad (5)$$

The pulse sequence server 710 also optionally receives patient data from a physiological acquisition controller 730. The controller 730 receives signals from a number of different sensors connected to the patient, such as electrocardiograph ("ECG") signals from electrodes, or respiratory signals from a bellows or other respiratory monitoring device. Such signals are typically used by the pulse sequence server 710 to synchronize, or "gate," the performance of the scan with the subject's heart beat or respiration.

The pulse sequence server 710 also connects to a scan room interface circuit 732 that receives signals from various sensors associated with the condition of the patient and the magnet system. It is also through the scan room interface circuit 732 that a patient positioning system 734 receives commands to move the patient to desired positions during the scan.

The digitized MR signal samples produced by the RF system 720 are received by the data acquisition server 712. The data acquisition server 712 operates in response to instructions downloaded from the workstation 702 to receive the real-time MR data and provide buffer storage, such that no data is lost by data overrun. In some scans, the data acquisition server 712 does little more than pass the acquired MR data to the data processor server 714. However, in scans that require information derived from acquired MR data to control the further performance of the scan, the data acquisition server 712 is programmed to produce such information and convey it to the pulse sequence server 710. For example, during prescans, MR data is acquired and used to calibrate the pulse sequence performed by the pulse sequence server 710. Also, navigator signals may be acquired during a scan and used to adjust the operating parameters of the RF system 720 or the gradient system 718, or to control the view order in which k-space is sampled. The data acquisition server 712 may also be employed to process MR signals used to detect the arrival of contrast agent in a magnetic resonance angiography ("MRA") scan. In all these examples, the data acquisition server 712 acquires MR data and processes it in real-time to produce information that is used to control the scan.

The data processing server 714 receives MR data from the data acquisition server 712 and processes it in accordance with instructions downloaded from the workstation 702. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 714 are conveyed back to the workstation 702 where they are stored. Real-time images are stored in a data base memory cache (not shown in FIG. 7), from which they may be output to operator display 712 or a display 736 that is located near the magnet assembly 724 for use by attending physicians. Batch mode images or selected real time images are stored in a host database on disc storage 738. When such images have been reconstructed and transferred to storage, the data processing server 714 notifies the data store server 716 on the workstation 702. The workstation 702 may be used by an operator to archive the images, produce films, or send the images via a network to other facilities.

Figure 8:
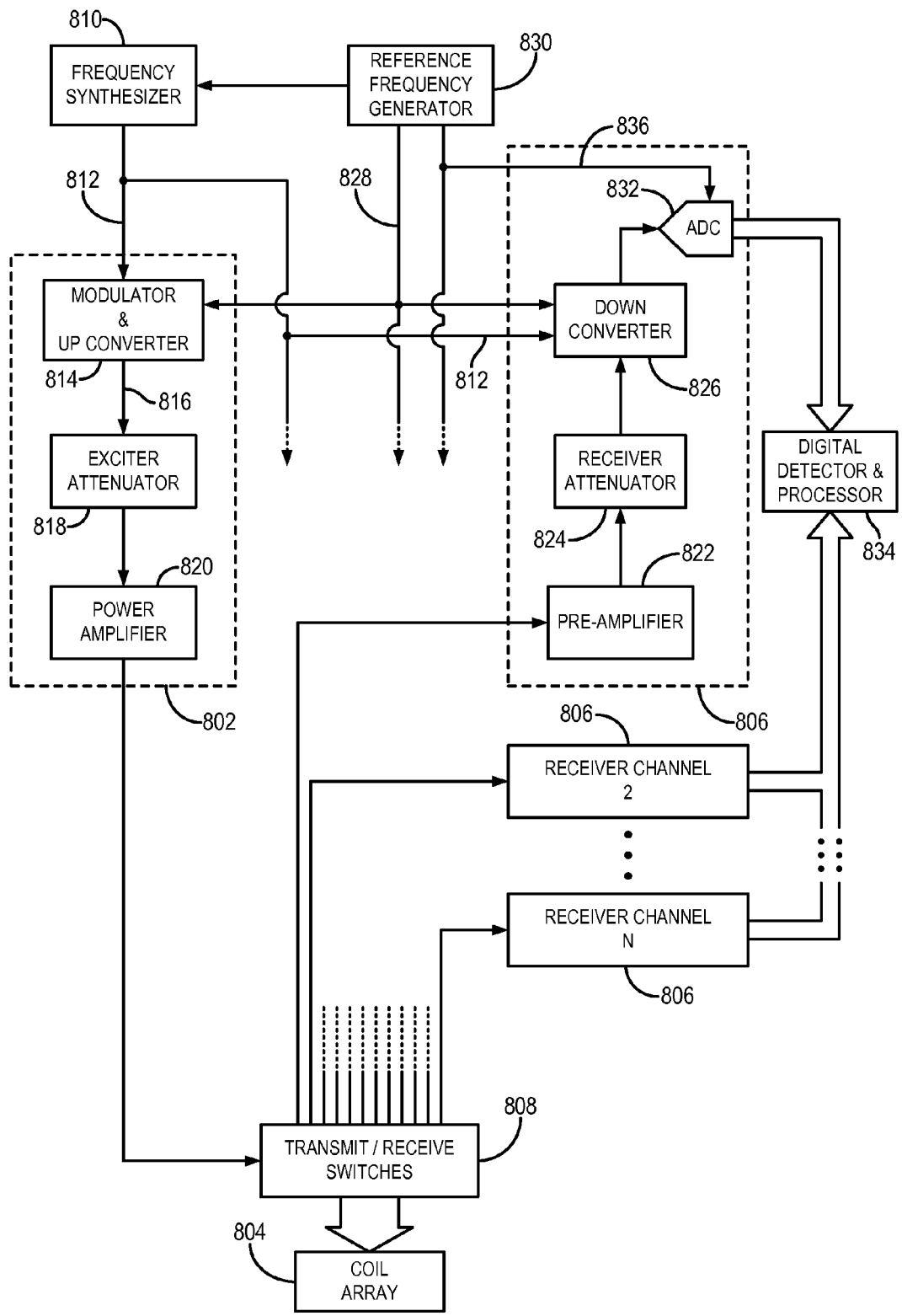
FIG. 8 is a block diagram of an exemplary radio frequency ("RF") system, including a parallel receiver coil array, that forms a part of a configuration of the MRI system of FIG. 7.

As shown in FIG. 7, the radiofrequency ("RF") system 720 may be connected to the whole body RF coil 728, or as shown in FIG. 8, a transmitter section of the RF system 720 may connect to at least one transmit channel 800 of a coil array 802, and its receiver section may connect to at least one receiver channel 804 of the coil array 802. Often, the transmitter section is connected to the whole body RF coil 728 or a local transmit coil (not shown), and, in so-called "parallel receiver" coil arrays, each receiver section is connected to a separate receiver channel 804.

Referring particularly to FIG. 8, the RF system 720 includes a transmitter that produces a prescribed RF excitation field. The base, or carrier, frequency of this RF excitation field is produced under control of a frequency synthesizer 806 that receives a set of digital signals from the pulse sequence server 710. These digital signals indicate the frequency and phase of the RF carrier signal produced at an output 808. The RF carrier is applied to a modulator and up converter 810 where its amplitude is modulated in response to a signal, R(t), also received from the pulse sequence server 710. The signal, R(t), defines the envelope of the RF excitation pulse to be produced and is produced by sequentially reading out a series of stored digital values. These stored digital values may be changed to enable any desired RF pulse envelope to be produced.

The magnitude of the RF excitation pulse produced at output 812 is attenuated by an exciter attenuator circuit 814 that receives a digital command from the pulse sequence server 710. The attenuated RF excitation pulses are applied to a power amplifier 816, which drives the RF coil array 802 through a transmit/receive ("T/R") switch 818.

Referring still to FIG. 8, the signal produced by the subject is picked up by the coil array 802 and applied to the inputs of a set of receiver channels 804. A pre-amplifier 820 in each receiver channel 804 amplifies the signal by an amount determined by a digital attenuation signal received from the pulse sequence server 710. The received signal is at or around the Larmor frequency, and this high frequency signal is down-converted in a two step process by a down converter 822, which first mixes the detected signal with the carrier signal on line 808 and then mixes the resulting difference signal with a reference signal on line 824. The down converted MR signal is applied to the input of an analog-to-digital ("A/D") converter 826 that samples and digitizes the analog signal and applies it to a digital detector and signal processor 828 that produces 16-bit in-phase (I) values and 16-bit quadrature (Q) values corresponding to the received signal. The resulting stream of digitized I and Q values of the received signal are output to the data acquisition server 712. The reference signal, as well as the sampling signal applied to the A/D converter 826, are produced by a reference frequency generator 830.

Figure 9:
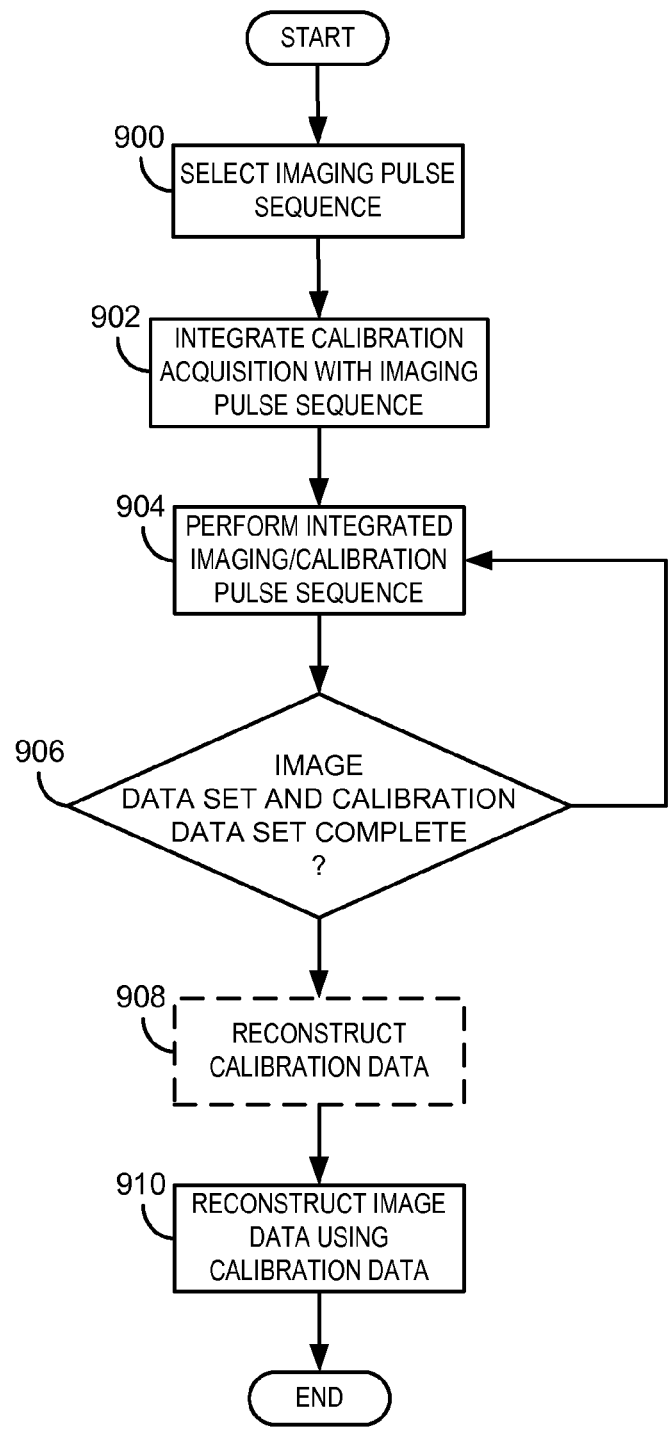
FIG. 9 is a flow chart setting for the steps of a method in accordance with the present invention and designed to be performed using a system, for example, such as illustrated in FIGS. 7 and 8.

Referring now to FIG. 9, a flow chart is illustrated that sets forth general steps of a method in accordance with the present invention that can be implemented using systems such as described above with respect to FIGS. 7 and 8. Specifically, at process block 900, the clinician selects a desired imaging pulse sequence and associated parallel imaging technique. For example, any of a variety of pulse sequences may be selected, as well as parallel imaging techniques, including SENSE and GRAPPA parallel imaging techniques.

At process block 902, the selected pulse sequence is integrated with the required calibration data, such as described above. That is, as described above, the calibration data and image data can be overlapped at some locations in k-space. By doing so, the need to redundantly sample the same k-space location, as would be the case with a separate calibration scan, can be eliminated. Thus, a marked decrease in scan time is achieved with by combining the collection of image data and calibration data. It is also possible, however, to combine the provided method with sampling patterns in which view sharing is performed. In such methods, certain image data samples will be shared from one time frame to the next, thereby providing a further decrease in scan time without detrimentally affecting net acceleration.

At process block 904, the integrated imaging/calibration pulse sequence is performed. Specifically, in accordance with some aspect of the present invention, a time-series undersampled k-space data set is acquired. The time-series undersampled k-space data set includes a selected number of k-space data subsets that include both image data and calibration data. Such data subsets that include both image data and calibration data can be referred to as "combined data sets." Within the selected number of k-space data subsets or combined data sets, the calibration data includes a portion of a desired total amount of calibration data. Furthermore, the calibration data and image data can be overlapped at some locations in k-space. Of course, not all of the image data will be or need be contained within such data subsets or so-called combined data sets.

The provided method of apportioning the acquisition of the calibration data across multiple time frames can be applied to the GRAPPA acceleration technique and to the SENSE acceleration technique. When applied to GRAPPA, the provided method reduces acceleration factor, R, erosion intrinsic to GRAPPA.

The pulse sequence is repeated as necessary to move through decision block 906, which yields the desired image and calibration data sets. Hence, at process block 908, the desired calibration data may be reconstructed into calibration images. In any case, at process block 910, the images of the subject, for example, a time-series of images, are reconstructed using the calibration data/images. These images are substantially free of undersampling artifacts. As such, the desired images of the subject are acquired using a parallel imaging technique whereby the requisite calibration data is acquired in an integrated fashion with the image data to thereby better realize, in a practical sense, the acceleration of the parallel imaging technique.

The above described systems and methods apply to a variety of imaging techniques and extend, for example, to two-dimensional (2D) and three-dimensional (3D) imaging alike. For example, in the context of 3D imaging, a further improvement has been devised for 3D time-resolved accelerated MR image acquisitions. For SENSE-like scans, acquisition of calibration data which is normally acquired in a scan independent of the accelerated time series is embedded within the individual frames comprising the time series, thereby eliminating the requirement for a separate calibration scan. For GRAPPA-like scans, a full set of calibration data is not acquired within each time frame, but rather a fraction of the full set is acquired within each time frame, thereby reducing the penalty of diminished acceleration intrinsic to GRAPPA.

The present invention has been described in terms of one or more preferred embodiments, and it should be appreciated that many equivalents, alternatives, variations, and modifications, aside from those expressly stated, are possible and within the scope of the invention.

The invention claimed is:

1. A magnetic resonance imaging (MRI) system, comprising:
   a magnet system configured to generate a polarizing magnetic field about at least a portion of a subject arranged in the MRI system;
   a magnetic gradient system including a plurality of magnetic gradient coils configured to apply at least one magnetic gradient field to the polarizing magnetic field;
   a radio frequency (RF) system configured to apply an RF field to the subject and to receive magnetic resonance signals therefrom in parallel;
   a computer system programmed to:
      control operation of the magnetic gradient system and RF system to perform a pulse sequence in accordance with a parallel imaging acquisition to acquire a time-series undersampled k-space data set that include both an image data set and a calibration data set; and reconstruct the image data set into a time-series of images of the subject using the calibration data set.

2. The system as recited in claim 1 in which acquiring the time-series, undersampled k-space data set includes repeatedly performing the pulse sequence to acquire the image data set and wherein portions of the calibration data set are acquired in a selected number of repetitions of the pulse sequence in conjunction with acquiring the image data set.

3. The system as recited in claim 2 in which the portions of the calibration data set acquired in the selected number of repetitions of the pulse sequence varies between each of the selected number of repetitions.

4. The system as recited in claim 3 in which the portions of the calibration data set acquired in the selected number of repetitions of the pulse sequence samples a different portion of k-space.

5. The system as recited in claim 2 in which at least one sampling point in the calibration data set overlaps with at least one sampling point in the image data set in each repetition of the pulse sequence.

6. A method for producing a time-series of images of a subject with a magnetic resonance imaging (MRI) system, the steps of the method comprising:
   acquiring with the MRI system, a time-series undersampled k-space data set in which a selected number of k-space data subsets in the time-series undersampled k-space data set include both image data and calibration data, and in which the calibration data in each of the selected number of k-space data subsets includes a portion of a desired total amount of calibration data; and producing a time-series of images of the subject by reconstructing images of the subject that are substantially free of undersampling artifacts from the acquired time-series undersampled k-space data sets.

7. The method as recited in claim 6 in which the calibration data in each of the selected number of k-space data subsets includes a different portion of the desired amount of total calibration data.

8. The method as recited in claim 7 in which the calibration data in each of the selected number of k-space data subsets samples a different portion of k-space.

9. The method as recited in claim 6 in which at least one sampling point in the calibration data in each of the selected number of k-space data subsets overlaps with at least one sampling point in the image data in each of the selected number of k-space data subsets.

10. A non-transitive, computer-readable storage medium having stored thereon a set of instructions that, when executed by a computer processor, causes the computer processor to control a magnetic resonance imaging (MRI) system to:

perform a pulse sequence that acquires a time-series k-space data set that includes a selected number of combined data sets that contain both calibration data and image data, and a number of image data sets that contain only image data; and wherein the calibration data in the selected number of combined data sets is acquired by sampling a different partition of a calibration sampling pattern for each of the selected number of combined data sets.

11. The computer-readable storage medium as recited in claim 10 in which the calibration data in each of the selected number of combined data sets includes a different portion of the a total calibration data included in the time-series k-space data set.

12. The computer-readable storage medium as recited in claim 11 in which the calibration data in each of the selected number of k-space data sets samples a different portion of k-space.

13. The computer-readable storage medium as recited in claim 10 in which at least one sampling point in the calibration data in each of the selected number of k-space data sets overlaps with at least one sampling point in the image data in each of the combined data sets.

* * * * *